United States Patent
Bi et al.

(10) Patent No.: US 10,734,281 B2
(45) Date of Patent: Aug. 4, 2020

(54) METHOD AND STRUCTURE TO FABRICATE A NANOPOROUS MEMBRANE

(71) Applicant: International Business Machines Corporation, Armonk, NY (US)

(72) Inventors: Zhenxing Bi, Niskayuna, NY (US); Kangguo Cheng, Schenectady, NY (US); Shogo Mochizuki, Clifton Park, NY (US); Hao Tang, Albany, NY (US)

(73) Assignee: ELPIS TECHNOLOGIES INC., Ottawa (CA)

( * ) Notice: Subject to any disclaimer, the term of this patent is extended or adjusted under 35 U.S.C. 154(b) by 137 days.

(21) Appl. No.: 15/699,695

(22) Filed: Sep. 8, 2017

(65) Prior Publication Data

US 2018/0053716 A1 Feb. 22, 2018

Related U.S. Application Data

(62) Division of application No. 15/242,045, filed on Aug. 19, 2016, now Pat. No. 9,768,104.

(51) Int. Cl.
*H01L 21/768* (2006.01)
*H01L 27/092* (2006.01)
*B82Y 40/00* (2011.01)

(52) U.S. Cl.
CPC ...... *H01L 21/76877* (2013.01); *H01L 27/092* (2013.01); *B81B 2203/0315* (2013.01); *B82Y 40/00* (2013.01); *H01L 21/76898* (2013.01)

(58) Field of Classification Search
CPC ....... B81B 2203/0315; H01L 21/76877; H01L 21/76898; B82Y 40/00
See application file for complete search history.

(56) References Cited

U.S. PATENT DOCUMENTS

| | | | |
|---|---|---|---|
| 6,413,792 B1 | 7/2002 | Sauer et al. | |
| 8,518,276 B2 | 8/2013 | Striemer et al. | |
| 8,852,407 B2 | 10/2014 | Peng et al. | |
| 8,986,629 B2 | 3/2015 | Deierling et al. | |
| 8,986,928 B2 | 3/2015 | Turner et al. | |
| 8,999,167 B2 | 4/2015 | Nakano et al. | |
| 9,085,120 B2 | 7/2015 | Astier et al. | |
| 2005/0193800 A1* | 9/2005 | DeBoer | G01N 27/128 73/1.06 |
| 2014/0190833 A1 | 7/2014 | Lieber et al. | |

(Continued)

OTHER PUBLICATIONS

Bi, Z. et al., "Nanoporous thin films with controllable nanopores processed from vertically aligned nanocomposites", Nanotechnology 21, Jun. 2010, 7 pages, 21.

(Continued)

*Primary Examiner* — Amar Movva
(74) *Attorney, Agent, or Firm* — Scully Scott Murphy and Presser (57) ABSTRACT

A self-assembled heteroepitaxial oxide nanocomposite film including alternating layers of a first metal oxide having a first melting point and a second metal oxide having a second melting point that differs from the first melting point is formed in an opening formed in a semiconductor substrate. After forming a metal or metal alloy via structure in the semiconductor substrate, first and second thermal treatments are performed to remove each layer of first or second metal oxide providing a nanoporous membrane.

20 Claims, 8 Drawing Sheets

(56) References Cited

U.S. PATENT DOCUMENTS

2015/0056732 A1     2/2015  Astier et al.
2016/0318757 A1*   11/2016  Chou ................. B81C 1/00595

OTHER PUBLICATIONS

Zang, W., et al., "Integration of Self-Assembled Vertically Aligned Nanocomposite {La0.7Sr0.3MnO3}1-x:(ZnO)x Thin Films on Silicon Substrates", ACS Appl. Mater. Interfaces, Apr. 2013, pp. 3995-3999, 5.

List of IBM Patents or Patent Applications Treated as Related Dated Sep. 8, 2017, 2 Pages.

* cited by examiner

METHOD AND STRUCTURE TO FABRICATE A NANOPOROUS MEMBRANE

BACKGROUND

The present application relates to semiconductor technology, and more particularly, to a semiconductor structure including a nanoporous membrane formed on a semiconductor substrate utilizing a self-assembled heteroepitaxial oxide nanocomposite film. The present application also provides a method of forming the same.

Nanoporous membranes are known and can be used in a wide variety of applications including, for example, in fuel cells, gas sensors, medical applications and biological applications. Nanoporous membranes can be formed by directly depositing a porous structure utilizing solution based technology. Alternatively, the porous structures that provide the nanoporous membranes can be formed utilizing a post deposition process such as, for example, chemical etching, electrochemical processing or high resolution photolithographic patterning.

Some of these processes used in providing the nanoporous membranes are very expensive. Alternatively or additionally, some of the processes may require multiple processing steps and/or are difficult to fabricate on semiconductor devices. As such, there is a need for providing nanoporous membranes that can be readily integrated on a semiconductor substrate such as, for example, silicon.

SUMMARY

A self-assembled heteroepitaxial oxide nanocomposite film including alternating layers of a first metal oxide having a first melting point and a second metal oxide having a second melting point that is lower the first melting point is formed in an opening formed in a semiconductor substrate. First and second thermal treatments are performed to remove each layer of second metal oxide providing a nanoporous membrane of the first metal oxide. The nanoporous membrane that is provided can be used in a wide variety of applications including, for instance, in fuel cells, gas sensors, medical applications and biological applications.

One aspect of the present application relates to a semiconductor structure that includes a nanoporous membrane. In one embodiment of the present application, the semiconductor structure includes a nanoporous membrane comprising a metal oxide located between a first semiconductor material portion and a second semiconductor material portion. In some embodiments, the semiconductor structure of the present application is bonded to a semiconductor wafer comprising complementary metal oxide semiconductor (CMOS) circuits.

Another aspect of the present application relates to a method of forming a semiconductor structure that includes a nanoporous membrane. In one embodiment of the present application, the method may include providing an opening extending partially into a semiconductor substrate. A self-assembled heteroepitaxial oxide nanocomposite film is then formed in the opening. The self-assembled heteroepitaxial oxide nanocomposite film that is employed includes alternating layers of a first metal oxide having a first melting point and a second metal oxide having a second melting point that is lower than the first melting point. Next, a first thermal treatment is performed to form initial pores in the self-assembled heteroepitaxial oxide nanocomposite film. An etch is then performed to expose a bottommost surface of the self-assembled heteroepitaxial oxide nanocomposite film having the initial pores. A second thermal treatment is then performed to convert the self-assembled heteroepitaxial oxide nanocomposite film having the initial pores into a nanoporous membrane.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
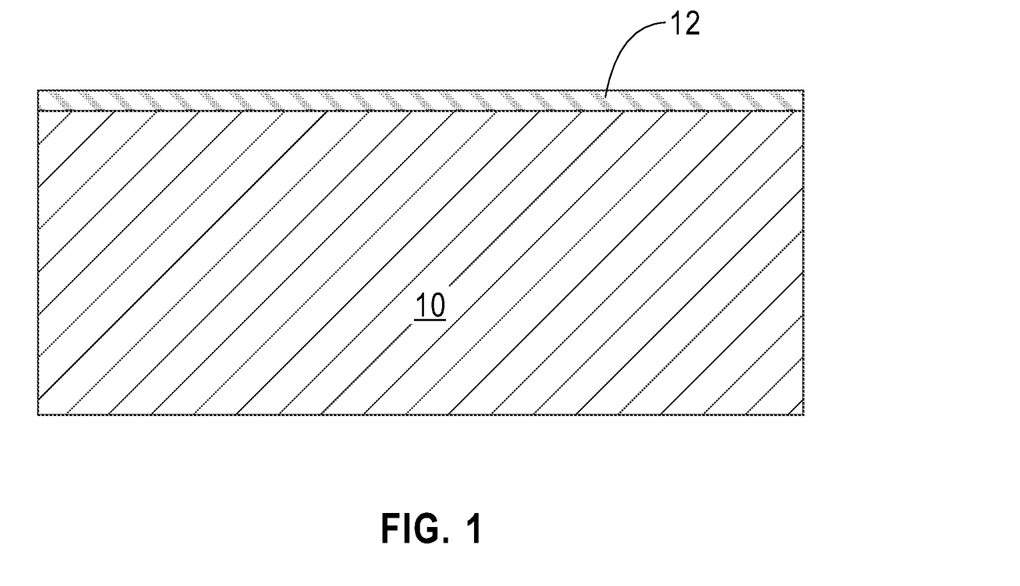
FIG. 1 is a cross sectional view of an exemplary semiconductor structure including a hard mask layer located on a surface of a semiconductor substrate that can be employed in the present application.

Referring first to FIG. 1, there is illustrated an exemplary semiconductor structure that can be employed in the present application. The exemplary semiconductor structure of FIG. 1 includes a hard mask layer 12 located on a surface (i.e., a topmost surface) of a semiconductor substrate 10.

The semiconductor substrate 10 that can be employed may include any semiconductor material or stack of semiconductor materials that have semiconducting properties. Examples of semiconductor materials that can be employed as the semiconductor substrate 10 include silicon (Si), germanium (Ge), silicon germanium (SiGe) alloys, silicon germanium carbide (SiGeC), silicon carbide (SiC), III-V compound semiconductors or II-VI compound semiconductors. In one example, the semiconductor substrate 10 is composed of silicon. In some embodiments, the semiconductor material that provides the semiconductor substrate 10 is a single crystalline semiconductor material such as, for example, single crystalline silicon.

The semiconductor substrate 10 is typically a bulk semiconductor substrate. The term "bulk" when used in conjunction with the term "semiconductor substrate" denotes that the entire substrate is composed of at least one semiconductor material. In other embodiments (not specifically shown) the semiconductor substrate 10 may include a semiconductor-on-insulator including, from bottom to top, a handle substrate, an insulator layer and a topmost semiconductor material layer. When an SOI substrate is employed, the topmost semiconductor material layer is generally selected to include the nanoporous membrane.

The hard mask layer 12 is a contiguous (i.e., without voids and/or breaks) that is formed across the entire topmost surface of the semiconductor substrate 10. The hard mask layer 12 may include any hard mask material or stack of hard mask materials including for example, silicon dioxide, silicon nitride, and/or silicon nitride. In one embodiment, the hard mask material that provides hard mask layer 12 can be formed by a deposition process such as, for example, chemical vapor deposition (CVD), or plasma enhanced chemical vapor deposition (PECVD). In another embodiment, the hard mask material that provides hard mask layer 12 can be formed by a thermal growth process such as, for example, thermal oxidation and/or nitridation. In yet another embodiment, the hard mask material that provides hard mask layer 12 can be formed by a combination of a deposition process and a thermal process. The hard mask material that provides hard mask layer 12 can have a thickness from 20 nm to 50 nm. Other thicknesses are however possible and are not excluded from being used.

Figure 2:
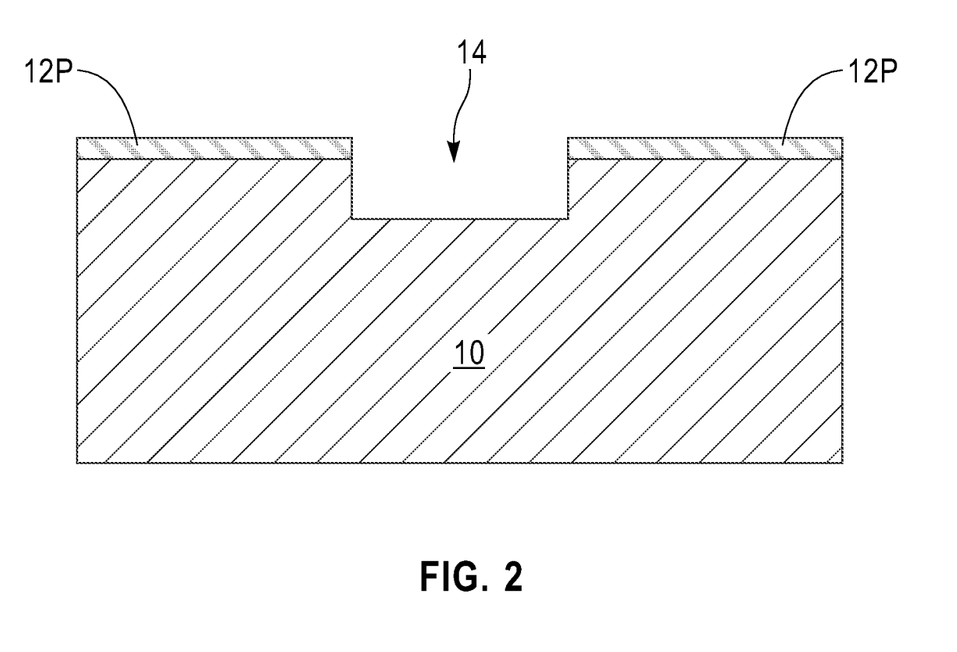
FIG. 2 is a cross sectional view of the exemplary semiconductor structure of FIG. 1 after forming an opening entirely through the hard mask layer and partially through the semiconductor substrate.

Referring now to FIG. 2, there is illustrated the exemplary semiconductor structure of FIG. 1 after forming an opening 14 entirely through the hard mask layer 12 and partially through the semiconductor substrate 10. Although a single opening 14 is described and illustrated, a plurality of openings 14 can be formed into the semiconductor substrate 10. After forming the opening 14, portions of the hard mask layer 12 remain on the semiconductor substrate 10. Each remaining portion of the hard mask layer 12 may be referred to herein as a hard mask portion 12P.

The opening 14 can be formed by a patterning process. In one embodiment, the patterning process may include lithography and etching. The lithographic process includes forming a photoresist (not shown) atop the hard mask layer 12, exposing the photoresist to a desired pattern of radiation and developing the exposed photoresist to provide a patterned photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the opening 14. The patterned photoresist can be removed any time after transferring the pattern into at least the hard mask layer 12. In one embodiment, the removal of the patterned photoresist may include ashing.

The opening 14 that is formed into the semiconductor substrate 10 defines an area in which a nanoporous membrane will be subsequently formed. The opening 14 may have a width, as measured from one sidewall of the opening 14 to another sidewall of the opening 14, of from 100 nm to 1000 nm. The depth of the opening 14 that is provided into the semiconductor substrate 10, as measured from the topmost surface of the semiconductor substrate 10 to the exposed surface of the semiconductor substrate 10, is from 100 nm to 500 nm. Other widths and/or depths are possible for the opening 14 and thus can be used in the present application. The opening 14 exposes a surface of the semiconductor substrate 10 that is located between the topmost surface and the bottommost surface of the semiconductor substrate 10.

Figure 3:
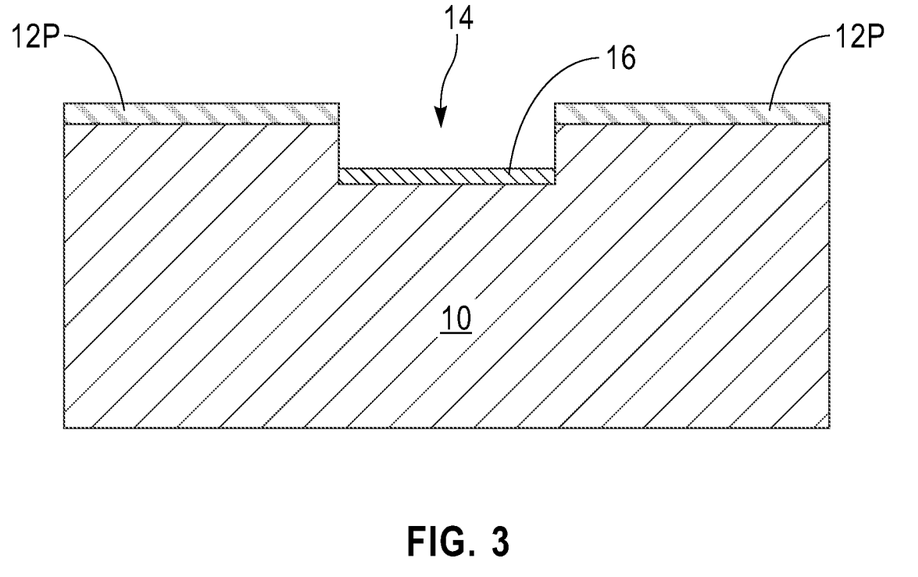
FIG. 3 is a cross sectional view of the exemplary semiconductor structure of FIG. 2 after forming an epitaxial buffer layer on an exposed portion of the semiconductor substrate within the opening.

Referring now to FIG. 3, there is illustrated the exemplary semiconductor structure of FIG. 2 after forming an epitaxial buffer layer 16 on an exposed portion (i.e., surface) of the semiconductor substrate 10 within the opening 14. In some embodiments, the epitaxial buffer layer 16 is omitted. In some embodiments, and prior to epitaxial buffer layer 16 formation, the exposed portion of the semiconductor substrate 10 is cleaned to remove native oxide and other contaminates from the exposed surfaces of the semiconductor substrate 10.

When employed, the epitaxial buffer layer 16 fills a lower portion of the opening 14 that is provided into the semiconductor substrate 10; an upper portion of the opening 14 that is provided into the semiconductor substrate 10 and the hard mask layer 12 remains unfilled.

The epitaxial buffer layer 16 includes a metal oxide which can aid in the formation of the subsequently formed self-assembled heteroepitaxial oxide nanocomposite film. Examples of metal oxides that can be employed as the epitaxial buffer layer 16 include, but are not limited to, $SrTiO_3$ or MgO.

The epitaxial buffer layer 16 can be formed utilizing an epitaxial growth or epitaxial deposition process. The terms "epitaxial growth and/or deposition" and "epitaxially formed and/or grown" mean the growth of a material, such as epitaxial buffer layer 16, on a deposition surface of another material, such as the exposed portion of semiconductor substrate 10, in which the material being grow, e.g., the epitaxial buffer layer 16, has the same crystalline characteristics as the another material, e.g., the semiconductor substrate 10, of the deposition surface. In an epitaxial deposition process, the chemical reactants provided by the source gases are controlled and the system parameters are set so that the depositing atoms arrive at the deposition surface of a material with sufficient energy to move around on the surface and orient themselves to the crystal arrangement of the atoms of the deposition surface. Therefore, an epitaxial material that is formed by an epitaxial deposition process has the same crystalline characteristics as the deposition surface on which it is formed. For example, an epitaxial material deposited on a {100} crystal surface will take on a {100} orientation. The epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming the epitaxial buffer layer 16 may include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 400° C. to 800° C.

The epitaxial buffer layer 16 may have a thickness from 5 nm to 20 nm. Other thicknesses that are lesser than, or greater than, the aforementioned thickness values may also be used in the present application as the thickness of the epitaxial buffer layer 16.

Figure 4A:
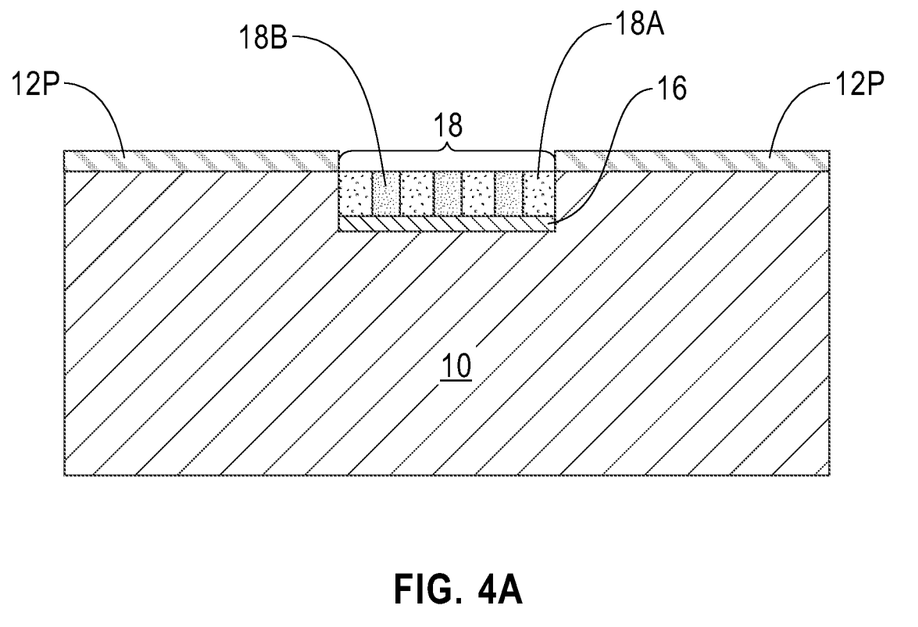
FIG. 4A is a cross sectional view of the exemplary semiconductor structure of FIG. 3 after forming a self-assembled heteroepitaxial oxide nanocomposite film on the epitaxial buffer layer.
Figure 4B:
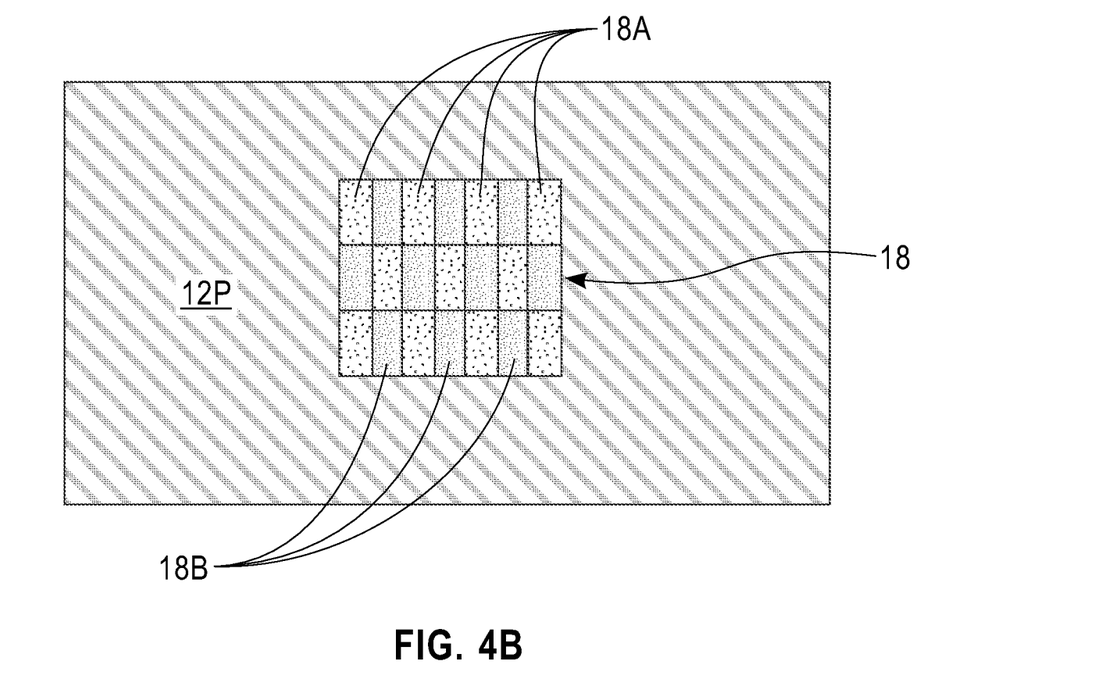
FIG. 4B is a top down view of the exemplary semiconductor structure of FIG. 4A.

Referring now to FIGS. 4A-4B, there is illustrated the exemplary semiconductor structure of FIG. 3 after forming a self-assembled heteroepitaxial oxide nanocomposite film 18 on the epitaxial buffer layer 16. The term "self-assembled heteroepitaxial oxide nanocomposite film" denotes a film having two distinct oxide phases which are arranged in an alternating fashion. In some embodiments in which the epitaxial buffer layer 16 is not employed, the self-assembled heteroepitaxial oxide nanocomposite film 18 may be formed on the exposed surface of the semiconductor substrate 10 within opening 14. The self-assembled heteroepitaxial oxide nanocomposite film 18 includes alternating layers of a first metal oxide (defining a first phase) having a first melting point and a second metal oxide (defining a second phase) having a second melting point that is lower than the first melting point. In the present drawings, element 18A denotes a layer of the first metal oxide, while element 18B denotes a layer of the second metal oxide.

The self-assembled heteroepitaxial oxide nanocomposite film 18 may be referred to as a vertically aligned nanocomposite that includes the alternating layers of the first metal oxide and the second metal oxide. As is shown in FIGS. 4A-4B, the self-assembled heteroepitaxial oxide nanocomposite film 18 forms columnar structures vertically and a nano checker board structure laterally.

The number of layers of the first metal oxide 18A that provide a first phase of the self-assembled heteroepitaxial oxide nanocomposite film 18 may vary. The number of layers of the second metal oxide 18B that provide a second phase of the self-assembled heteroepitaxial oxide nanocomposite film 18.

Examples of materials that can provide the self-assembled heteroepitaxial oxide nanocomposite film 18 include, but are not limited to, $BaTiO_3$:$CoFe_2O_4$, $Pb(Zr_{0.52}Ti_{0.48})O_3$:$NiFe_2O_4$, $BiFeO_3$:$CoFe_2O_4$, $BiFeO_3$:$CoFe_2O_4$, $PbTiO_3$:$CoFe_2O_4$, or $BiFeO_3$:$La_{0.7}Sr_{0.3}MnO_3$.

In one embodiment, the self-assembled heteroepitaxial oxide nanocomposite film 18 can be formed utilizing a pulse laser deposition process. In another embodiment, the self-assembled heteroepitaxial oxide nanocomposite film 18 can be formed utilizing molecular beam epitaxy. The self-assembled heteroepitaxial oxide nanocomposite film 18 has a topmost surface that is typically coplanar with a topmost surface of the semiconductor substrate 10. The self-assembled heteroepitaxial oxide nanocomposite film 18 may have a thickness from 10 nm to 500 nm. Other thicknesses that are lesser than, or greater than, the aforementioned thickness values may also be used in the present application as the thickness of the self-assembled heteroepitaxial oxide nanocomposite film 18.

Figure 5:
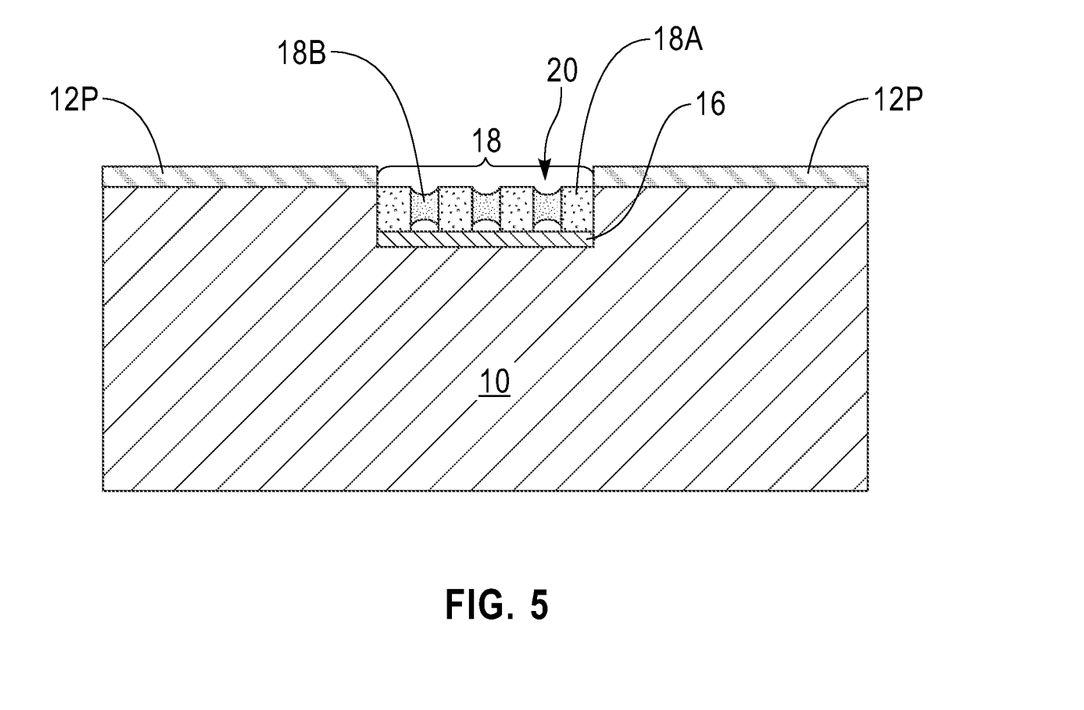
FIG. 5 is a cross sectional view of the exemplary semiconductor structure of FIG. 4A after performing a first thermal treatment to form initial pores in the self-assembled heteroepitaxial oxide nanocomposite film.

Referring now to FIG. 5, there is illustrated the exemplary semiconductor structure of FIG. 4A after performing a first thermal treatment to form initial pores 20 in the self-assembled heteroepitaxial oxide nanocomposite film 18. The first thermal treatment may be referred to as an initial pore forming process. That is, the first thermal treatment removes a portion of each layer of second metal oxide 18B to form initial pores 20 in the self-assembled heteroepitaxial oxide nanocomposite film 18; the first thermal treatment does not affect each layer of the first metal oxide 18A. During the first thermal treatment each layer of the second metal oxide 18B undergoes partially decomposition, vaporization and diffusion.

In one embodiment, the first thermal treatment may include annealing. In one example, the anneal may be a furnace anneal. In another example, the anneal may be a rapid thermal anneal. In yet another example, the anneal may include a laser anneal. Notwithstanding the type of the anneal, the anneal is performed in an inert ambient such as, for example, helium, argon, neon or any mixture thereof, and at a first temperature that is above the second melting point of each layer of second metal oxide 18B, but below the melting point of each layer of the first metal oxide 18A. In one embodiment of the present application, the first temperature is from 500° C. to 700° C. The anneal used as the first thermal treatment may be carried out for various periods of time. In one example, the anneal used as the first thermal treatment may be carried out for a time period from about 10 minutes to 30 minutes.

In another embodiment, the first thermal treatment may include UV thermal treatment. When a UV thermal treatment is performed, the UV thermal treatment includes utilizing a source that can generate light. In some embodiments, the light may have a wavelength from 10 nm to 380 nm.

Figure 6:
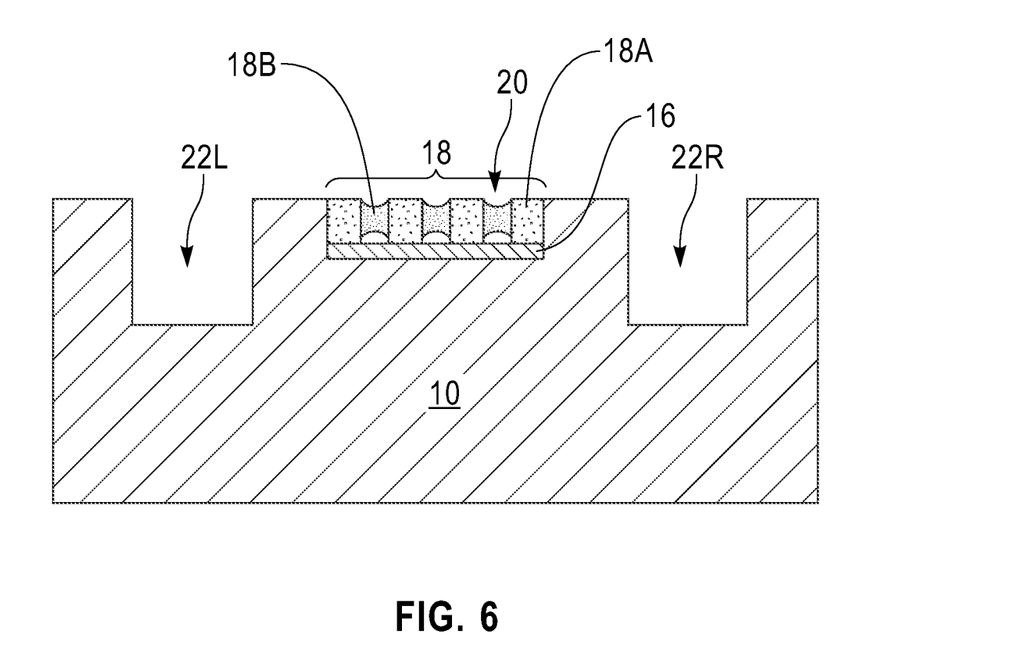
FIG. 6 is a cross sectional view of the exemplary semiconductor structure of FIG. 5 after forming via openings in the semiconductor substrate.

Referring now to FIG. 6, there is illustrated the exemplary semiconductor structure of FIG. 5 after forming via openings 22L, 22R in the semiconductor substrate 10. Via opening 22L is formed on one side of the opening 14 containing the self-assembled heteroepitaxial oxide nanocomposite film 18 having initial pores 20, while via opening 22R is formed on another side of the opening 14 containing the self-assembled heteroepitaxial oxide nanocomposite film 18 having the initial pores 20. In some embodiments as is shown, the via openings 22L, 22R are formed partially into the semiconductor substrate 10. In another embodiment, each via opening may extend entirely through the semiconductor substrate 10. Each via opening 22L, 22R that is formed has a depth that is greater than the depth of opening 14 mentioned above. Each via opening 22L, 22R can be formed by a patterning process such as, for example, lithography and etching as described above. In some embodiments and following via opening 22L, 22R formation, the hard mask portions 12P can be removed utilizing a removal process that is selective in removing the hard mask portions 12P; such an embodiment is illustrated in the present application. In other embodiments, the hard mask portions 12P may remain in the exemplary semiconductor structure can be removed later. For example, the hard mask portions 12P can be removed after formation of the metal or metal alloy via structures in each via opening 22L, 22R.

Figure 7:
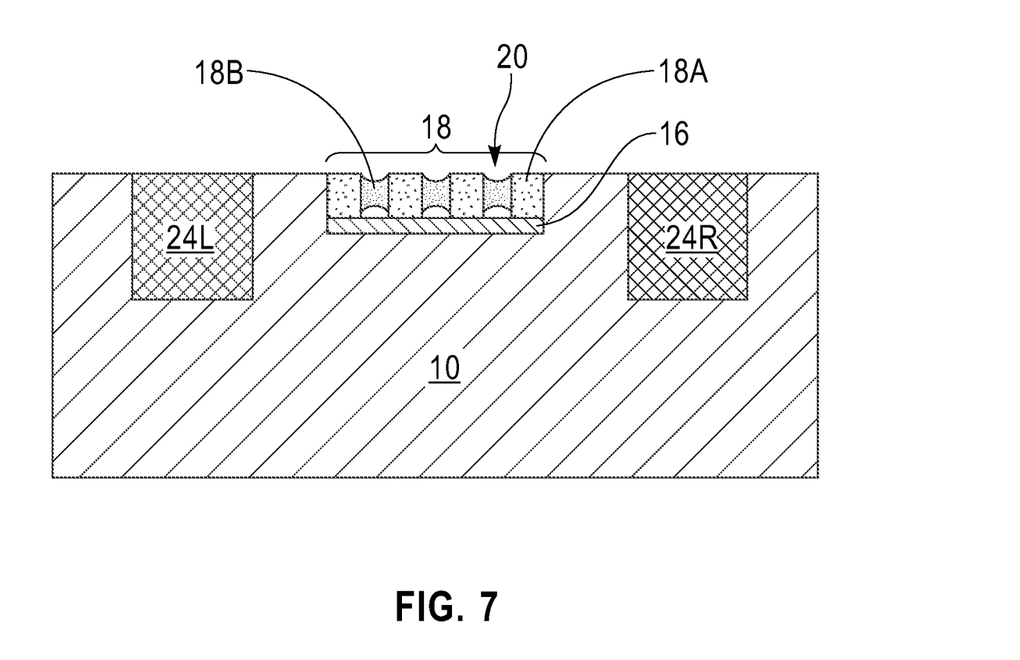
FIG. 7 is a cross sectional view of the exemplary semiconductor structure of FIG. 6 after forming a metal or metal alloy via structure in each of the via openings.

Referring now to FIG. 7, there is illustrated the exemplary semiconductor structure of FIG. 6 after forming a metal or metal alloy via structure 24L, 24R in each of the via openings 22L, 22R. Each metal or metal alloy via structure 24L, 24R may be composed of a metal or metal alloy such as, for example, copper (Cu), a copper-aluminum alloy (Cu—Al), a copper-manganese alloy (Cu—Mn), aluminum (Al), or an aluminum-copper alloy (Al—Cu).

In some embodiments and prior to forming metal or metal alloy, a diffusion barrier (not show) can be optionally formed within each via opening 22L, 22R. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. In some embodiments, the diffusion barrier may have a thickness from 2 nm to 50 nm; although other thicknesses for the diffusion barrier material are contemplated and can be employed in the present application. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier. In cases in which the metal or metal alloy to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within each via opening 22L, 22R. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

A layer of a metal or metal alloy is then formed into each via opening 22L, 22R utilizing a deposition process such as, for example, chemical vapor deposition (CVD), plasma enhanced chemical vapor deposition (PECVD), sputtering, chemical solution deposition or plating. In one embodiment, a bottom-up plating process can be employed. Following the deposition of the layer of metal or metal alloy, a planarization process such as, for example, chemical mechanical polishing (CMP) and/or grinding, can be used to remove the metal or metal alloy (i.e., overburden material) that is present outside each via opening 22L, 22R forming metal or metal alloy via structures 24L, 24R shown in FIG. 7. The planarization stops on a topmost surface of the semiconductor substrate 10. The planarization process can, in some embodiments, remove the hard mask portions 12P from the structure and can expose a topmost surface of the semiconductor substrate 10.

In some embodiments of the present application, the formation of the metal alloy via structures can be formed after performing the second thermal treatment. In some embodiments, the metal alloy via structure formation may be omitted. In other embodiments, a polycrystalline silicon layer can be formed above exposed portions of the semiconductor substrate 10 and the self-assembled heteroepitaxial oxide nanocomposite film 18 having the initial pores 20 and prior to performing the second thermal treatment. In such an embodiment, the polycrystalline silicon layer can be removed after performing the second thermal treatment. In yet other embodiments, the polycrystalline silicon layer may remain in the final structure.

Figure 8:
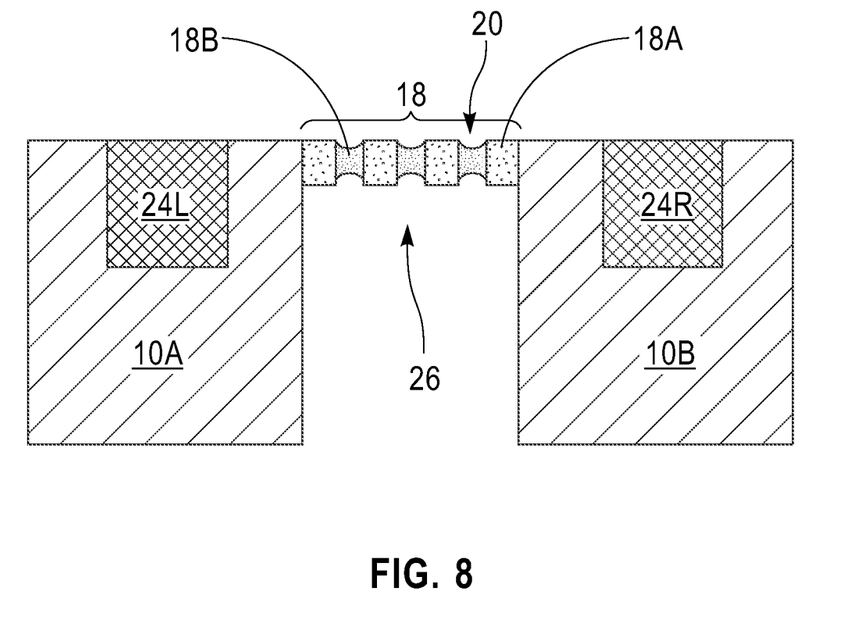
FIG. 8 is a cross sectional view of the exemplary semiconductor structure of FIG. 7 after performing an etch to expose a bottommost surface of the self-assembled heteroepitaxial oxide nanocomposite film having the initial pores.

Referring now to FIG. 8, there is illustrated the exemplary semiconductor structure of FIG. 7 after performing an etch to expose a bottommost surface of the self-assembled heteroepitaxial oxide nanocomposite film 18 having the initial pores 20. The etch removes portions of the semiconductor substrate 10 and, if present, the epitaxial buffer layer 16 that are present beneath the self-assembled heteroepitaxial oxide nanocomposite film 18 having the initial pores 20. The etch may include a lithographic step to define the region to be etched. If a lithographic step is employed, the patterned photoresist is formed on the bottommost surface of the semiconductor substrate 10 (it is noted that the topmost surface of the semiconductor substrate 10 denotes the surface containing the self-assembled heteroepitaxial oxide nanocomposite film 18, while the bottommost surface of the semiconductor substrate 10 denotes the surface that is opposed to the surface containing the self-assembled heteroepitaxial oxide nanocomposite film 18).

This step provides a cavity 26 between remaining portions of the semiconductor substrate 10. Each remaining portion of the semiconductor substrate 10 may be referred to as a semiconductor material portion. In the illustrated embodiment, element 10A denotes a first semiconductor material portion, while element 10B denotes a second semiconductor material portion. The first and second semiconductor material portions 10A, 10B are spaced apart from each other by at least cavity 26 and the composite film 18 having the initial pores 20.

In one embodiment, the etch used to provide cavity 26 may include an anisotropic etch such as, for example, reactive ion etching. An anisotropic provides a cavity 26 having vertical sidewalls (as illustrated in FIG. 8). In some embodiments (not shown) an isotropic etch may be used to create a cavity. An isotropic etch process a cavity having tapered sidewalls.

Figure 9A:
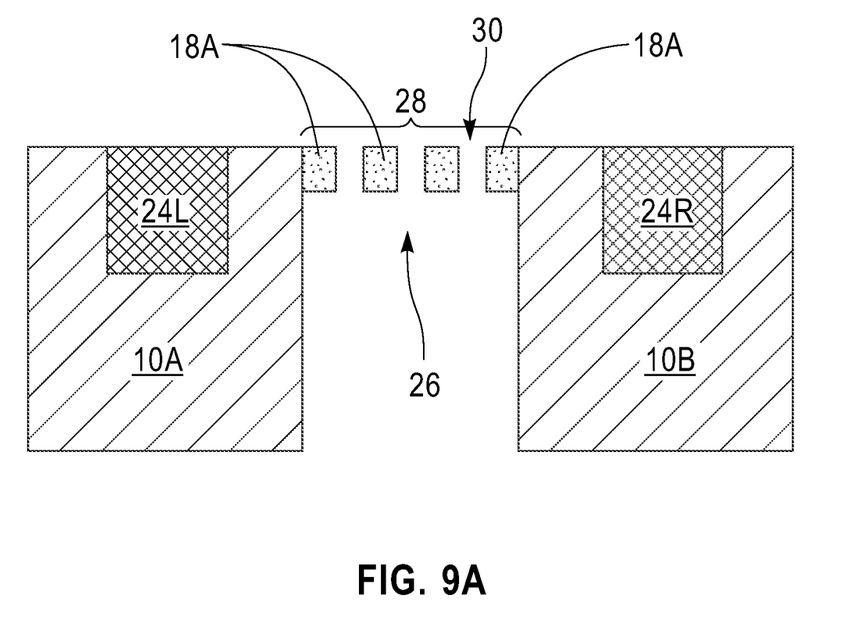
FIG. 9A is a cross sectional view of the exemplary semiconductor structure of FIG. 8 after performing a second thermal treatment to convert the self-assembled heteroepitaxial oxide nanocomposite film having the initial pores into a nanoporous membrane.
Figure 9B:
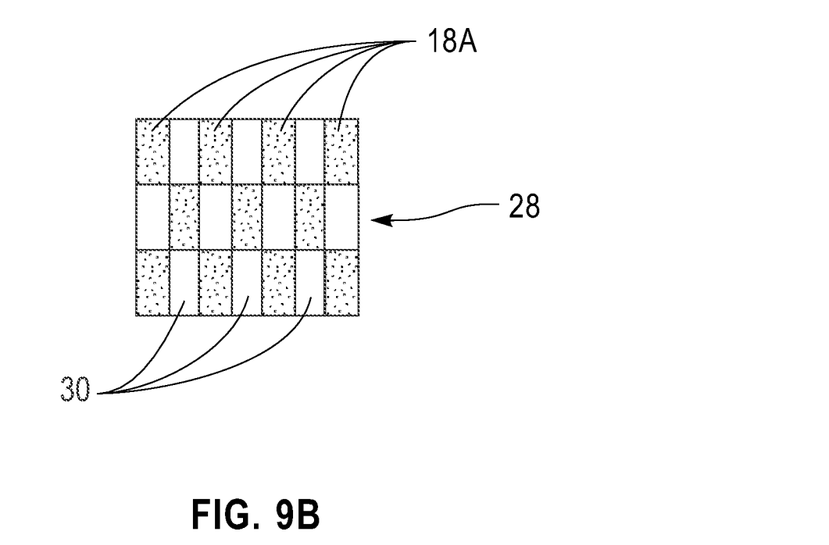
FIG. 9B is a top down view illustrating the nanoporous membrane shown in FIG. 9A.

Referring now to FIG. 9A, there is illustrated, the exemplary semiconductor structure of FIG. 8 after performing a second thermal treatment to convert the self-assembled heteroepitaxial oxide nanocomposite film 18 having the initial pores 20 into a nanoporous membrane 28. The second thermal treatment removes remaining portions of each layer of the second metal oxide 18B. The second thermal treatment may be referred to a final pore forming process. FIG. 9B illustrates a magnified top down view of the nanoporous membrane 28 shown in FIG. 9A.

The nanoporous membrane 28 comprises layers of the first metal oxide 18A that are spaced apart from each other by pores 30. In one embodiment, the nanoporous membrane comprises layers of the first metal oxide 18A containing a cation of metal and anion of oxygen in the oxidation state of 2.

Each pore 30 comprises a volume of a layer of the second metal oxide 18B that is now entirely removed. The nanoporous membrane 28 has a topmost surface that is coplanar with a topmost surface of each semiconductor material portion 10A, 10B.

The second thermal treatment may include one of the processes mentioned above for the first thermal treatment. In one embodiment, the second thermal treatment comprises a same thermal treatments the first thermal treatment. In another embodiment, the second thermal treatment comprises a different thermal treatment than the first thermal treatment. During the second thermal treatment each layer of the second metal oxide 18B undergoes complete decomposition, vaporization and diffusion.

Figure 10:
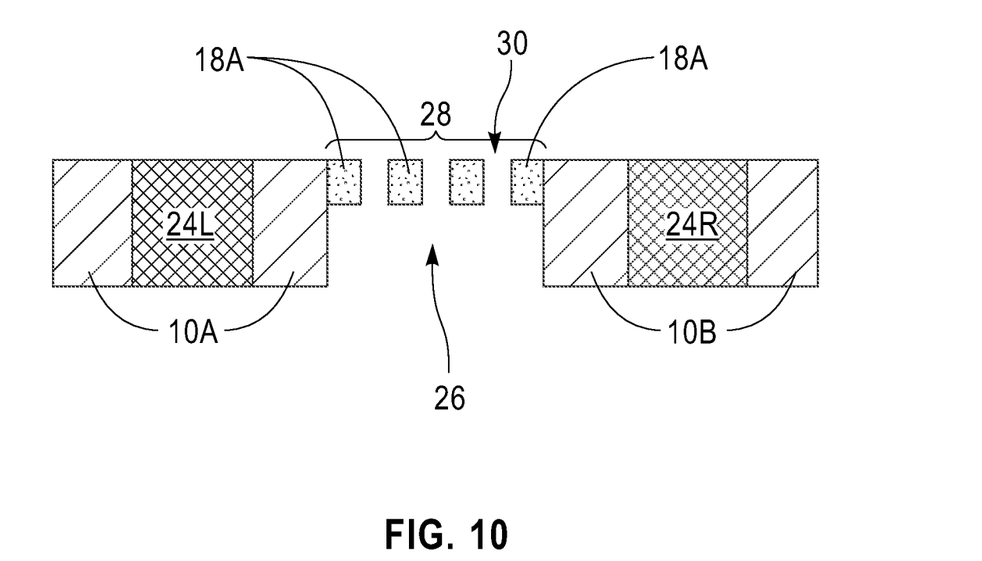
FIG. 10 is a cross sectional view of the exemplary semiconductor structure of FIG. 9A after thinning remaining portions of the semiconductor substrate.

Referring now to FIG. 10, there is illustrated the exemplary semiconductor structure of FIG. 9A after thinning the remaining portions of the semiconductor substrate 10 (i.e., semiconductor material portions 10A, 10B). In some embodiments such as when the via openings are formed entirely through the semiconductor substrate 10, the thinning step may be omitted. When employed, thinning may include a chemical mechanical polishing (CMP) step or an etch back process. Thinning is performed to expose a surface of each metal or metal alloy via structure 24L, 24R.

Figure 11:
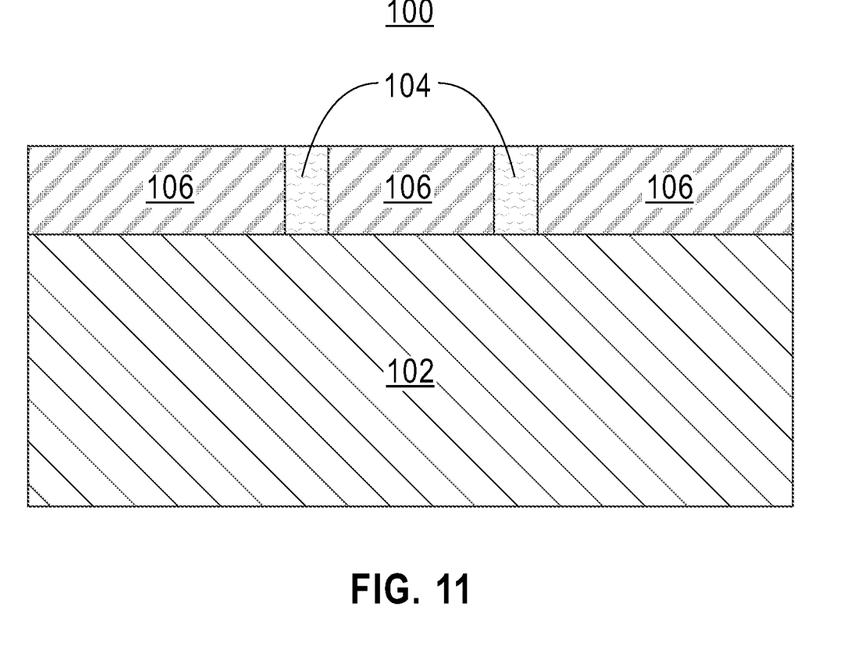
FIG. 11 is a cross sectional view of a semiconductor wafer that contains CMOS circuitry that can be employed in the present application.

Referring now to FIG. 11, there is illustrated a semiconductor wafer 100 that contains CMOS circuitry that can be employed in the present application. The semiconductor wafer 100 may include a semiconductor substrate 102 containing a plurality of CMOS devices, i.e., field effect transistors, 104 located thereon. The semiconductor wafer 100 may also include a planarizing dielectric material 106 such as, for example, silicon oxide, surrounding the CMOS devices 104. The semiconductor wafer shown in FIG. 11 includes materials that are well known to those skilled in the art. Also, the semiconductor wafer 100 can be formed utilizing techniques well known to those skilled. So as not to obscure the present application, the materials and processing used in the providing the semiconductor wafer 100 are not described in detail herein.

Figure 12:
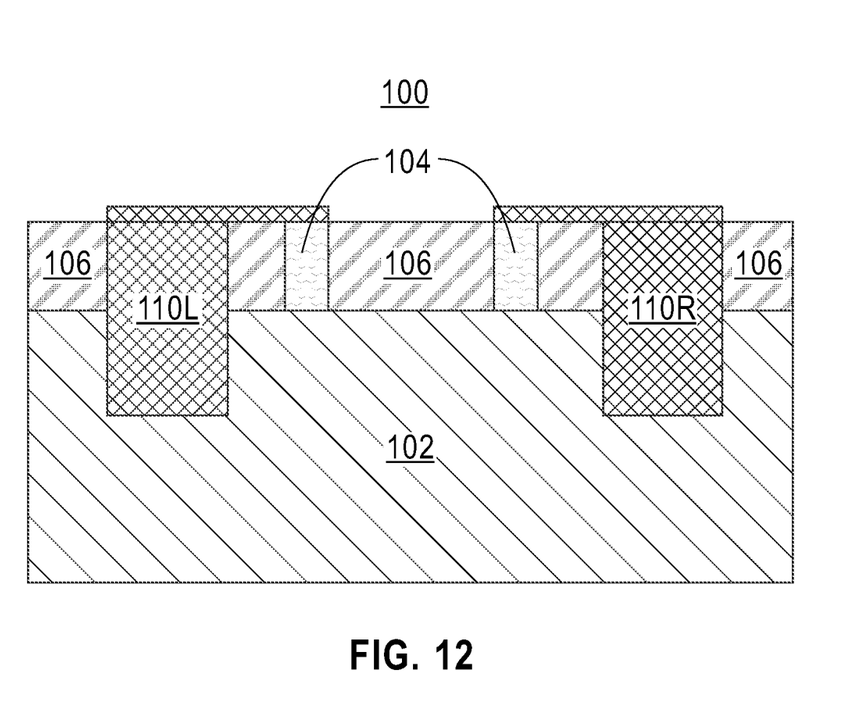
FIG. 12 is a cross sectional view of the semiconductor wafer of FIG. 11 after forming via openings in the semiconductor wafer and filling the via openings with a metal or metal alloy.

Referring now to FIG. 12, there is illustrated the semiconductor wafer 100 of FIG. 11 after forming via openings in the semiconductor wafer 100 and filling the via openings with a metal or metal alloy to provide metal or metal alloy via structures 110L, 110R; in this embodiment, portions of the metal or metal alloy via structures may extend above the planarizing dielectric material 106. The via openings and subsequent formation of the metal or metal alloy structures include materials and processing as mentioned above in forming the metal or metal alloy via structure 24L, 24R described above.

Figure 13:
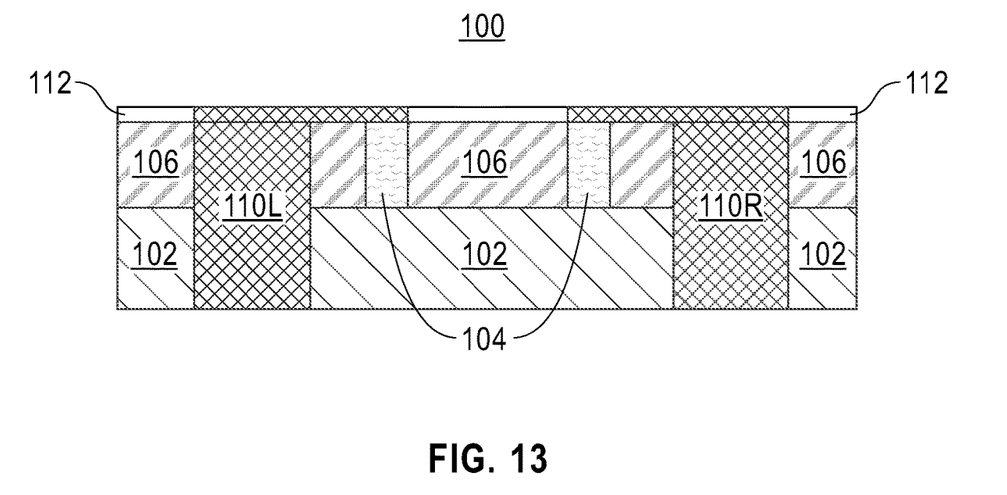
FIG. 13 is a cross sectional view of the semiconductor wafer of FIG. 12 after thinning the semiconductor wafer.

Referring now to FIG. 13, there is illustrated the semiconductor wafer of FIG. 12 after thinning the semiconductor wafer. That is, semiconductor substrate 102 of the semiconductor wafer 100 is thinned. Thinning may be performed utilizing one of the techniques mentioned above for thinning, the remaining portions of the semiconductor substrate 10. Prior to or after thinning an interlevel dielectric material 112 such as, for example, a low k dielectric material having a dielectric constant of less than silicon dioxide, can be formed over the planarizing dielectric material 106.

Figure 14:
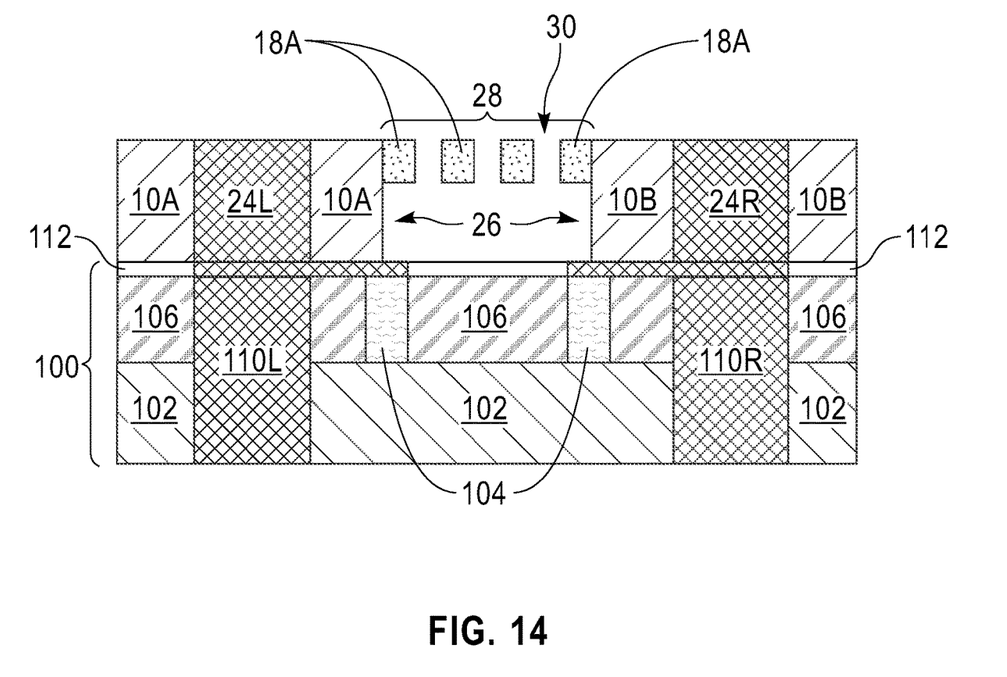
FIG. 14 is a cross sectional view of the exemplary semiconductor structure of FIG. 10 after bonding it to the semiconductor wafer shown in FIG. 13.

Referring now to FIG. 14, there is the exemplary semiconductor structure of FIG. 10 after bonding it to the semiconductor wafer 100 shown in FIG. 13. As is illustrated, the semiconductor wafer 100 shown in FIG. 13 is bonded to a surface of the remaining portions of semiconductor substrate (i.e., first and second semiconductor material portions 10A, 10B) that is opposite a surface including the nanoporous membrane 28. As is shown, in FIG. 14, the metal or metal alloy via structures 110L, 110R of the semiconductor wafer 100 are in direct contact with the metal or metal alloy via structures 24L, 24R present in the semiconductor substrate.

Bonding can be performed utilizing any conventional bonding process. In some embodiments, a solder bump such as, for example, a lead-free solder, can be formed on the surface of the metal or metal alloy via structures that are being bonded together. As is shown, the CMOS devices 104 are located at a bottom of cavity 26. As such, during use, materials can be passed through the nanoporous membrane 28 and be subsequently analyzed/detected by the underlying CMOS devices 104.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a suspended nanoporous membrane consisting of a plurality of metal oxide layers and a plurality of gaps arranged in a checkerboard pattern and located laterally between a first semiconductor material portion and a second semiconductor material portion.

2. The semiconductor structure of claim 1, wherein a topmost surface of said suspended nanoporous membrane is coplanar with a topmost surface of both said first semiconductor material portion and said second semiconductor material portion.

3. The semiconductor structure of claim 1, wherein a metal or metal alloy structure is present in a via opening present in each of said first semiconductor material portion and said second semiconductor material portion.

4. The semiconductor structure of claim 3, wherein said metal or metal alloy structure in said first semiconductor material portion extends entirely through said first semiconductor material portion, and said metal or metal alloy structure in said second semiconductor material portion extends entirely through said second semiconductor material portion.

5. The semiconductor structure of claim 1, wherein each of said metal oxide layers comprises a metal oxide containing a cation of a metal and an anion of oxygen in the oxidation state of 2.

6. The semiconductor structure of claim 1, wherein a cavity is present beneath said suspended nanoporous membrane and between said first semiconductor material portion and said second semiconductor material portion.

7. The semiconductor structure of claim 6, wherein each gap is in communication with said cavity.

8. The semiconductor structure of claim 1, wherein each of said first semiconductor material portion and said second semiconductor material portions comprises silicon.

9. The semiconductor structure of claim 1, further comprising a semiconductor wafer bonded to a bottommost surface of each of said first semiconductor material portion and said second semiconductor material portion, said semiconductor wafer comprising complementary metal oxide semiconductor (CMOS) circuitry.

10. The semiconductor structure of claim 9, wherein said semiconductor wafer includes metal or metal alloy via structures extending entirely through said semiconductor wafer and located adjacent said CMOS circuitry.

11. The semiconductor structure of claim 10, wherein said metal or metal alloy via structures of said semiconductor wafer are in direct contact with metal or metal alloy via structures present in said first and second semiconductor material portions.

12. The semiconductor structure of claim 1, wherein at least one of said metal oxide layers is direct physical contact with a sidewall of said first semiconductor material portion, and at least one another of said metal oxide layers is in direct physical contact with a sidewall of said second semiconductor material portion.

13. The semiconductor structure of claim 1, wherein each of said metal oxide layers has a topmost surface that is coplanar with each other and a bottommost surface that is coplanar with each other.

14. A semiconductor structure comprising:
a suspended nanoporous membrane consisting of a plurality of metal oxide layers and a plurality of gaps arranged in a checkerboard pattern and located laterally between a first semiconductor material portion and a second semiconductor material portion;
a first metal or metal alloy structure extending entirely through said first semiconductor material portion;
a second metal or metal alloy structure extending entirely through said second semiconductor material portion; and
a cavity present beneath said suspended nanoporous membrane and between said first semiconductor material portion and said second semiconductor material portion, wherein each gap is in communication with said cavity.

15. The semiconductor structure of claim 14, wherein each of said metal oxide layers comprises a metal oxide containing a cation of a metal and an anion of oxygen in the oxidation state of 2.

16. The semiconductor structure of claim 14, further comprising a semiconductor wafer bonded to a bottommost surface of each of said first semiconductor material portion and said second semiconductor material portion, said semiconductor wafer comprising complementary metal oxide semiconductor (CMOS) circuitry.

17. The semiconductor structure of claim 16, wherein said semiconductor wafer includes metal or metal alloy via structures extending entirely through said semiconductor wafer and located adjacent said CMOS circuitry.

18. The semiconductor structure of claim 17, wherein said metal or metal alloy via structures of said semiconductor wafer are in direct contact with metal or metal alloy via structures present in said first and second semiconductor material portions.

19. The semiconductor structure of claim 14, wherein at least one of said metal oxide layers is direct physical contact with a sidewall of said first semiconductor material portion, and at least one another of said metal oxide layers is in direct physical contact with a sidewall of said second semiconductor material portion.

20. The semiconductor structure of claim 14, wherein each of said metal oxide layers has a topmost surface that is coplanar with each other and a bottommost surface that is coplanar with each other.

* * * * *